(12) United States Patent
Kondo

(10) Patent No.: US 11,797,241 B2
(45) Date of Patent: Oct. 24, 2023

(54) PRINTING APPARATUS AND METHOD FOR CONTROLLING PRINTING APPARATUS

(71) Applicant: SEIKO EPSON CORPORATION, Tokyo (JP)

(72) Inventor: Ryota Kondo, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/937,839

(22) Filed: Oct. 4, 2022

(65) Prior Publication Data

US 2023/0106613 A1 Apr. 6, 2023

(30) Foreign Application Priority Data

Oct. 6, 2021 (JP) .................................. 2021-164646

(51) Int. Cl.
*H03K 17/96* (2006.01)
*G06F 3/12* (2006.01)

(52) U.S. Cl.
CPC .......... *G06F 3/1229* (2013.01); *G06F 3/1204* (2013.01); *G06F 3/1279* (2013.01); *H03K 17/96* (2013.01)

(58) Field of Classification Search
CPC ..................................................... H03K 17/96
USPC ......................................................... 327/143
See application file for complete search history.

(56) References Cited

U.S. PATENT DOCUMENTS

2017/0229860 A1* 8/2017 Vakilian ................. H05B 47/18

FOREIGN PATENT DOCUMENTS

JP 2013-188941 A 9/2013

* cited by examiner

*Primary Examiner* — Tomi Skibinski
(74) *Attorney, Agent, or Firm* — WORKMAN NYDEGGER

(57) ABSTRACT

A printing apparatus includes a connector configured to receive supply of first power from outside, a switch circuit configured to supply the first power to a regulator, a latch circuit configured to control the switch circuit, a power switch configured to hold the latch circuit in a predetermined state, a controller configured to hold the latch circuit in the predetermined state and to detect an operation of the power switch, and a storage configured to store setting information. In response to supply of the first power to the connector, the latch circuit is configured to, when supplied with the first power and when the predetermined state is a first state, switch on the switch circuit to supply the first power to the regulator. The regulator is configured to generate second power based on the supplied first power and to supply the second power to the controller and the storage. The controller is configured to, when the setting information in the storage is valid, maintain the latch circuit in the first state without performing detection of the operation of the power switch.

7 Claims, 5 Drawing Sheets

PRINTING APPARATUS AND METHOD FOR CONTROLLING PRINTING APPARATUS

The present application is based on, and claims priority from JP Application Serial Number 2021-164646, filed Oct. 6, 2021, the disclosure of which is hereby incorporated by reference herein in its entirety.

BACKGROUND

1. Technical Field

The present disclosure relates to a printing apparatus and a method for controlling a printing apparatus.

2. Related Art

As disclosed in JP-A-2013-188941, a power activator of a printing apparatus has been known in which, using a momentary type of switch as a power switch, upon switch-on of a circuit breaker, a controller determines the state of the power switch and, if the power switch is in an off-state, an automatic activation unit as any electrical circuit switches on the switch.

However, the configuration of the power activator described in the above document in which the momentary switch is switched on using the automatic activation unit is complex, and it has been difficult to accomplish activation with a simple configuration.

SUMMARY

According to an aspect of the present disclosure, a printing apparatus includes a connector configured to receive supply of first power from outside, a switch circuit configured to supply the first power to a regulator, a latch circuit configured to control the switch circuit, a power switch configured to hold the latch circuit in a predetermined state, a controller configured to hold the latch circuit in the predetermined state and to detect an operation of the power switch, and a storage configured to store setting information. In response to supply of the first power to the connector, the latch circuit is configured to, when supplied with the first power and when the predetermined state is a first state, switch on the switch circuit to supply the first power to the regulator. The regulator is configured to generate second power based on the supplied first power and to supply the second power to the controller and the storage. The controller is configured to, when the setting information in the storage is valid, maintain the latch circuit in the first state without performing detection of the operation of the power switch.

According to another aspect of the present disclosure, provided is a method for controlling a printing apparatus including a connector configured to receive supply of first power from outside, a switch circuit configured to supply the first power to a regulator, a latch circuit configured to control the switch circuit, a power switch configured to hold the latch circuit in a predetermined state, and a storage configured to hold the latch circuit in the predetermined state and to store setting information. The method includes, in response to supply of the first power to the connector, by the latch circuit, when the latch circuit is supplied with the first power and when the predetermined state is a first state, switching on the switch circuit to supply the first power to the regulator; generating, by the regulator, second power based on the supplied first power and supplying the second power to the storage; and when the setting information in the storage is valid, maintaining the latch circuit in the first state without performing detection of an operation of the power switch.

DESCRIPTION OF EXEMPLARY EMBODIMENTS

Embodiments

Embodiments will be described below with reference to the accompanying drawings. A printing apparatus 1 according to the embodiments is used for, for example, a point of sale (POS) system. POS systems are systems used for business operations in, for example, retail businesses, such as shopping centers, department stores, convenience stores, and train sales service, and in restaurant businesses, such as restaurants, coffee shops, and Japanese pubs. POS systems have a function of processing payment in accordance with a product or service purchased by a customer, a function of issuing a receipt for the payment, and so on.

In, for example, stores of retail businesses and restaurant businesses, when it becomes desired to issue a receipt or the like for a payment, a staff member operates a POS system to transmit print data from a computer to the printing apparatus 1 and to issue a receipt using the printing apparatus 1, and gives the receipt to a customer.

The printing apparatus 1 is located on a counter, where payment is made, in a store. In a large-scale store, a plurality of counters are provided on which a plurality of printing apparatuses 1 are located. The staff member may wish to individually power on each of the printing apparatuses 1, for example, for maintenance and may also wish to simultaneously power on the plurality of printing apparatuses 1, for example, at the time of store closure. Both of the wishes are to be fulfilled.

1-1. Configuration of Printing Apparatus

Figure 1:
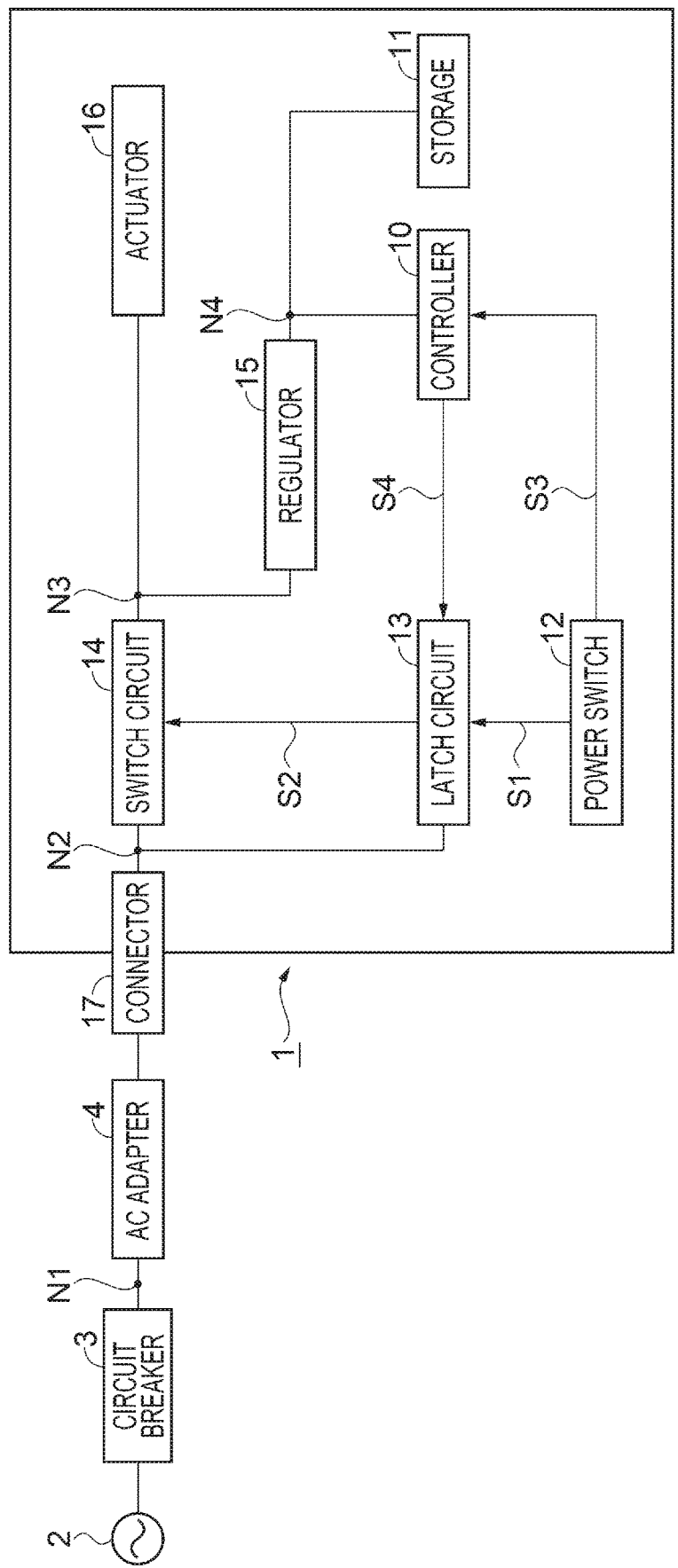
FIG. 1 is a block diagram illustrating a configuration of a printing apparatus.

As illustrated in FIG. 1, the printing apparatus 1 is designed to include a controller 10, a storage 11, a power switch 12, a latch circuit 13, a switch circuit 14, a regulator 15, an actuator 16, and a connector 17.

The controller 10 is designed to include a central processing unit (CPU) that provides overall control of the components of the printing apparatus 1, a universal asynchronous receiver transmitter (UART) that manages input and output, a field programmable gate array (FPGA) and a programmable logic device (PLD) that are logic circuits, and so on. The CPU may also be referred to as a processor.

The storage 11 is designed to include a flash read-only memory (ROM) and a hard disk drive, which are rewritable nonvolatile memories, a random-access memory (RAM) that is a volatile memory, and so on.

The CPU of the controller 10 reads out programs, such as firmware, and setting information stored in the nonvolatile memory of the storage 11 and executes the programs using the RAM of the storage 11 as a work area.

The actuator 16 comprises a transport mechanism including a transport motor that rotates a transport roller, a printing mechanism including a head that performs printing, a cutting mechanism including a cutter motor that moves a cutting blade, and so on.

The recording medium is, for example, thermal paper. In this case, the head is a line thermal head. The controller 10 drives the transport motor of the transport mechanism to rotate the transport roller so as to transport thermal paper, drives a line thermal head of the printing mechanism so as to print the thermal paper, and drives the cutter motor of the cutting mechanism to move the cutting blade so as to cut off the printed sheet of thermal paper. The sheet of thermal paper that has been printed and cut off is passed as a receipt from the staff member to the customer.

In FIG. 1, N denotes a node serving as a junction point and, in the present embodiment, is used particularly in indicating a location where voltage is applied. S is used in denoting a signal. A commercial power supply 2 is a power supply that supplies, for example, power of an alternating current (AC) voltage of 100 V (AC power of 100 V). A circuit breaker 3, which is a molded case circuit breaker, can be switched on or off. The commercial power supply 2 supplies AC power of 100 V through the circuit breaker 3 to an AC adapter 4.

When a staff member switches on the circuit breaker 3, AC power of 100 V is applied to a node N1 after the circuit breaker 3. The node N1 is provided with an electrical outlet, to which a plug of the AC adapter 4 is coupled. When the staff member switches off the circuit breaker 3, the supply of AC power of 100 V is discontinued and thus the node N1 is at 0 V.

The AC adapter 4 is capable of converting AC power of 100 V to output, for example, power of a direct current (DC) voltage of 24 V (DC power of 24 V). Hereinafter, "DC" may be omitted in referring to DC voltage.

Note that the features of the AC adapter 4 may be included in the printing apparatus 1. Specifically, for example, a smoothing circuit, a switching regulator, and so on, which are circuits that convert AC power of 100 V to DC power of 24V, may be provided at the subsequent stage of the connector 17 and at the preceding stage of the node N2 in the printing apparatus 1.

The connector 17 can receive supply of 24 V, which is first power, from the outside using the AC adapter 4 or the like. When the circuit breaker 3 is switched on and the AC adapter 4 is coupled to the connector 17 of the printing apparatus 1 by the staff member, 24 V is applied to the node N2 after the connector 17 and thus power is supplied to the printing apparatus 1. As a result, 24 V is supplied from the connector 17 to the switch circuit 14 and the latch circuit 13.

In addition, the staff member may pull out the AC adapter 4 from the connector 17 of the printing apparatus 1 in an attempt to discontinue the supply of power to the printing apparatus 1. Alternatively, the staff member may pull out the plug of the AC adapter 4 from the electrical outlet in an attempt to discontinue the supply of power to the printing apparatus 1.

The latch circuit 13 is, for example, designed to include a combination of NPN and PNP transistors. The latch circuit 13 is a circuit that, due to the combination of these transistors, retains the on-state once the circuit has been switched on, or retains the off-state once the circuit has been switched off. As described below, the latch circuit 13 may be switched on or off and retain such a state by receiving input of a signal S1 from the power switch 12 or a signal S4 from the controller 10 as a so-called trigger signal.

By wiring of a terminal of the NPN transistor or the PNP transistor in the latch circuit 13 to the ground (GND) level, the initial state of the latch circuit 13 when supplied with 24 V may be either the on-state or the off-state. In the present embodiment, the wiring is performed such that the initial state of the latch circuit 13 is the on-state. In addition, the latch circuit 13 may be constituted by a logic circuit.

The switch circuit 14 is, for example, designed to include a metal-oxide-semiconductor field-effect transistor (MOSFET). When a voltage is applied between the gate (G) and source (S), the MOSFET is switched on such that the MOSFET is conductive between the drain (D) and S.

The latch circuit 13 is capable of switching on or off the switch circuit 14 by outputting a signal S2 to the switch circuit 14. For example, when the latch circuit 13 is switched on and outputs the switch-on signal S2 to the switch circuit 14, a voltage is applied between G and S of the MOSFET of the switch circuit 14. Thus, the MOSFET is switched on such that the MOSFET is conductive between D and S. As a result, the switch circuit 14 outputs 24 V. In this way, the latch circuit 13 controls the switch circuit 14.

In addition, when the latch circuit 13 is switched off and outputs the switch-off signal S2 to the switch circuit 14, no voltage is applied between G and S of the MOSFET of the switch circuit 14. Thus, the MOSFET is switched off to be non-conductive between D and S. As a result, the output of the switch circuit 14 is 0 V.

When switched on, the switch circuit 14 outputs 24 V, and therefore 24 V is applied to a node N3. As a result, 24 V is supplied to the regulator 15 and the actuator 16.

The regulator 15 is, for example, a linear regulator. Specifically, the regulator 15 includes a so-called three-terminal regulator including three terminals, which are an input terminal, an output terminal, and a ground terminal, and constitutes a constant voltage circuit.

Upon receiving input of 24 V, the regulator 15 outputs second power, which is a logic voltage, of 3.3 V. At this point, 3.3 V is applied to a node N4. As a result, the controller 10 and the storage 11 are supplied with 3.3 V and thus are enabled to run. The CPU of the controller 10 may be activated.

The logic voltage is a voltage for causing integrated circuits (ICs) of the controller 10 and the storage 11 to operate. In contrast, 24 V is a voltage for causing the actuator 16 and the like to operate.

The power switch 12 is a so-called momentary type of switch, which is switched to the on-state when the staff member performs an operation, such as depressing a button with a finger, and returns to the off-state when the finger is removed from the button. The momentary type of switch is also referred to as a non-latching type of switch. Hereinafter, an operation of the power switch 12 performed by the staff member may be referred to as depressing.

Other than the momentary type of switch, there is an alternate type of switch, which is switched to the on-state once the button is depressed and remains in the on-state without returning to the off-state even when the finger is removed from the button. The alternate type of switch, in which the button is kept depressed during the on-state, will be used under the condition that a gap is located around the button. Foreign matter or liquid might enter the gap. For use in restaurant businesses where foreign matter or liquid is particularly easy to enter the gap, an alternate switch is not desirable.

A momentary switch does not readily result in a gap around a button, and therefore entry of foreign matter or liquid into the device on which the switch is mounted is less likely. In addition, the surface of the momentary switch is flat in both the on and off states, and therefore dirt or the like is easily removed from the momentary switch. Thus, the momentary switch may be suitably used in restaurant businesses in which the printing apparatus 1 is installed.

When the staff member depresses the power switch 12, the power switch 12 is switched to the on-state. At this point, the power switch 12 is enabled to output the switch-on signal S1 as a trigger signal to the latch circuit 13. As a result, the latch circuit 13 is switched on, enabling the switch circuit 14 to be switched on to apply 24V to the node N3.

In this way, the power switch 12 may hold the latch circuit 13 in the on-state, which is a predetermined state and is a first state.

In addition, when depressed, the power switch 12 is enabled to output a switch-on signal S3 to the controller 10. As a result, the controller 10 may detect depression of the power switch 12 through the input of the signal S3.

However, setting information for making it valid or invalid for the controller 10 to output a signal S4 to the latch circuit 13, without depending on the signal S3 from the power switch 12, is stored in the storage 11. The controller 10 may read out the setting information from the storage 11 and determine whether to output the signal S4 to the latch circuit 13, without depending on the signal S3 from the power switch 12, and performs or does not perform the output.

For example, when the setting information stored in the storage 11 is valid, the controller 10 outputs the signal S4 to the latch circuit 13 without depending on the signal S3 from the power switch 12. In this case, the signal S4 is a signal for switching on the latch circuit 13.

In other words, the controller 10 outputs the signal S4 to the latch circuit 13 without detecting the signal S3, that is, without performing detection of depression of the power switch 12. The fact that the controller 10 performs control without detection of the signal S3, that is, without based on the detection of depression of the power switch 12 is also referred to as ignoring the signal S3.

The controller 10 may output the switch-on signal S4 to switch on the latch circuit 13 and may switch on the switch circuit 14 to apply 24 V to the node N3 to power on the printing apparatus 1. If the switch circuit 14 has already been switched on, the controller 10 may maintain the on-state of the switch circuit 14.

In this way, when the setting information is valid, the staff member may supply power to the printing apparatus 1 by switching on the circuit breaker 3 even without depressing the power switch 12. That is, the staff member may power on a plurality of printing apparatuses 1 simultaneously by switching on the circuit breaker 3.

In this case, under the condition that the circuit breaker 3 is switched on, the staff member may also supply power to the printing apparatus 1 to power on the printing apparatus 1, without depressing the power switch 12, by coupling the AC adapter 4 to the connector 17 of the printing apparatus 1 and coupling the plug of the AC adapter 4 to an electrical outlet.

In addition, when the setting information is valid, under the condition that the printing apparatus 1 is powered on, the staff member does not depress the power switch 12 but switches off the circuit breaker 3 to discontinue the supply of power to the printing apparatus 1. The staff member may power off a plurality of printing apparatuses 1 simultaneously by switching off the circuit breaker 3.

Alternatively, under the condition that the circuit breaker 3 is switched on, the staff member may also discontinue the supply of power to the printing apparatus 1 to power off the printing apparatus 1, without depressing the power switch 12, by removing the AC adapter 4 from the connector 17 of the printing apparatus 1 or removing the plug of the AC adapter 4 from the electrical outlet.

In contrast, when the setting information stored in the storage 11 is invalid, in response to the power switch 12 being depressed by the staff member, the controller 10 detects input of the signal S3 from the power switch 12 and outputs the signal S4 to the latch circuit 13. In this case, the signal S4 is a signal for switching on the latch circuit 13.

In this way, the controller 10 may hold the latch circuit 13 in the on-state, which is the predetermined state and is the first state.

As a result, the controller 10 may switch on the latch circuit 13 and may switch on the switch circuit 14 to apply 24 V to the node N3 to power on the printing apparatus 1. If the switch circuit 14 has already been switched on, the controller 10 may maintain the switch circuit 14 in the on-state.

In this way, when the setting information is invalid, the staff member may power on the printing apparatuses 1, one by one, during the maintenance or the like by depressing the power switch 12.

In addition, when the setting information is invalid, under the condition that the printing apparatus 1 is powered on, in response to the power switch 12 being depressed by the staff member, the controller 10 detects input of the signal S3 from the power switch 12 and outputs the signal S4 to the latch circuit 13. In this case, the signal S4 is a signal for switching off the latch circuit 13.

As a result, the controller 10 may cause the latch circuit 13 to be in the off-state, which is the predetermined state and a second state, and may switch off the switch circuit 14 to stop applying 24 V to the node N3 such that the node N3 is at 0 V.

The regulator 15 ceases to receive input of 24 V and thus outputs 0 V. As a result, the node N4 is at 0V. The controller 10 and the storage 11 cease to be supplied with 3.3 V and thus are down, that is, stop to operate. As a result, the printing apparatus 1 is in a powered-off state.

In this way, when the setting information is invalid, the staff member may power off the printing apparatuses 1, one by one, by depressing the power switch 12 during the maintenance or the like.

As described above, when the setting information is invalid, under the condition that the printing apparatus 1 is powered on, in response to the power switch 12 being depressed by the staff member, the controller 10 detects input of the signal S3 from the power switch 12, powers off the printing apparatus 1, and goes down.

At this point, prior to going down, the controller 10 may store, in the storage 11, information to the effect that the printing apparatus 1 is powered off based on depression of the power switch 12. Hereinafter, the information to the effect that the printing apparatus 1 is powered off based on depression of the power switch 12 will be referred to as power-off information.

After powering off of the printing apparatus 1, when power is next supplied to the printing apparatus 1 and the controller 10 is thus activated, the controller 10 checks whether the power-off information is stored, by referring to the storage 11.

In the case where the power-off information is not stored in the storage 11, the controller 10 may determine that switching off of the circuit breaker 3, removal of the AC adapter 4, and so on were performed by the staff member without the power switch 12 being depressed and that the supply of power to the printing apparatus 1 was thus forcibly discontinued.

Then, the controller 10 may determine that switching on of the circuit breaker 3, coupling of the AC adapter 4, and so on were performed by the staff member and that the supply of power to the printing apparatus 1 was thus forcibly performed without the power switch 12 being depressed.

Accordingly, in the case where the power-off information is not stored in the storage 11 when the controller 10 is activated, without depending on the signal S3 from the power switch 12, the signal S4 may be output to the latch circuit 13 to switch on the latch circuit 13 and to switch on the switch circuit 14, thereby powering on the printing apparatus 1.

The case where the power-off information is not stored in the storage 11 includes the case where the CPU of the controller 10 was reset because of an error or the like. Even in this case, the controller 10 performs operations similar to those in the case where the power-off information is not stored, as described above.

However, in the case where the power-off information is stored in the storage 11, the controller 10 may determine that the printing apparatus 1 was powered off by depression of the power switch 12 and thereafter the power switch 12 was depressed by the staff member in an attempt to power on the printing apparatus 1.

The controller 10 may store setting information in the storage 11 according to a command specifying the setting information from a computer of the POS system. In addition, the controller 10 may also store setting information in the storage 11 based on an operation on a panel or sensor (not illustrated) included in the printing apparatus 1.

1-2. Method for Controlling Printing Apparatus

With reference to FIGS. 2 to 5, a method for controlling the printing apparatus 1 will be described. Each of the figures illustrates the states of the connector 17 and the subsequent node N2, the states of the latch circuit 13 and the signal S2 output therefrom, the states of the switch circuit 14 and the subsequent node N3, the states of the regulator 15 and the subsequent node N4, the states of the power switch 12 and the signals S1 and S3 output therefrom, and the states of the controller 10 and the signal S4 output therefrom. The printing apparatus 1 performs the process according to the arrows in the figures.

Figure 2:
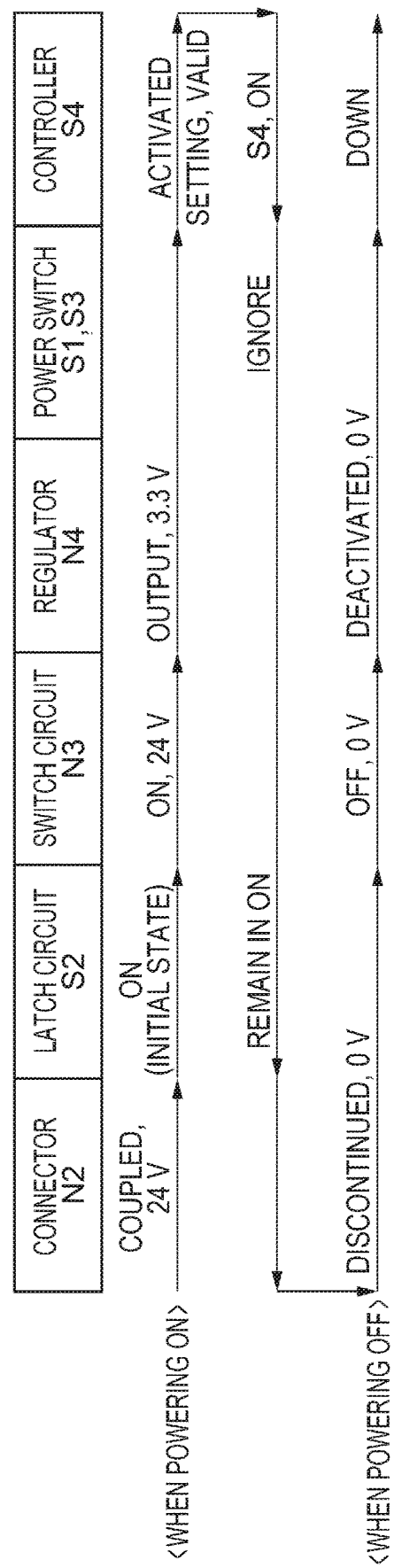
FIG. 2 is a state transition diagram when setting information is valid.

Initially, with reference to FIG. 2, a description is given of a control method for powering on the printing apparatus 1 in the case where the setting information stored in the storage 11 is valid.

In this case, assume that switching on of the circuit breaker 3, coupling of the AC adapter 4, and so on were performed by the staff member and that the supply of power to the printing apparatus 1 has thus been performed without the power switch 12 being depressed.

At this point, 24 V is applied to the node N2 after the connector 17, and 24 V is supplied from the connector 17 to the switch circuit 14 and the latch circuit 13.

The latch circuit 13 is configured such that the initial state is the on-state, as described above. Therefore, when supplied with 24 V, the latch circuit 13 is switched on and outputs the switch-on signal S2 to the switch circuit 14 to switch on the switch circuit 14. As a result, the switch circuit 14 outputs 24 V, 24 V is applied to the node N3, and 24 V is supplied to the regulator 15 and the actuator 16.

The regulator 15 supplied with 24 V outputs 3.3 V, and 3.3 V is applied to the node N4. As a result, 3.3 V is supplied to the controller 10 and the storage 11, enabling the CPU of the controller 10 to be activated.

The controller 10 in which the CPU is activated reads out the setting information stored in the storage 11. Hereinafter, the setting information will be referred to simply as setting. In this case, the setting is valid. Since the setting is valid, the controller 10 ignores the signal S3 from the power switch 12 and outputs the switch-on signal S4 to the latch circuit 13.

Since the latch circuit 13 has already been switched on, the latch circuit 13 remains in the on-state and the switch circuit 14 also remains in the on-state, and thus 24 V may continue to be supplied. As a result, the printing apparatus 1 is in a powered-on state.

Subsequently, a description is given of a control method for powering off the printing apparatus 1 in the case where the setting stored in the storage 11 is valid.

In this case, assume that switching off of the circuit breaker 3, removal of the AC adapter 4, and so on were performed by the staff member and that the supply of power to the printing apparatus 1 has thus been discontinued without the power switch 12 being depressed.

When the supply of power to the printing apparatus 1 is discontinued, the node N2 after the connector 17 is at 0 V. The supply of 24 V from the connector 17 to the latch circuit 13 and the switch circuit 14 is blocked, and thus the switch circuit 14 is switched off and the node N3 is at 0 V.

Accordingly, the supply of 24 V to the regulator 15 is blocked, and thus the regulator 15 is deactivated and the node N4 is at 0 V. The supply of 3.3 V to the controller 10 and the storage 11 is blocked, and thus the controller 10 and the storage 11 go down and the printing apparatus 1 is powered off.

When switching on of the circuit breaker 3, coupling of the AC adapter 4, and so on are performed by the staff member and thus power is supplied to the printing apparatus 1, as described above, the controller 10 may power on the printing apparatus 1, regardless of depression of the power switch 12, in the case where the setting stored in the storage 11 is valid.

Figure 3:
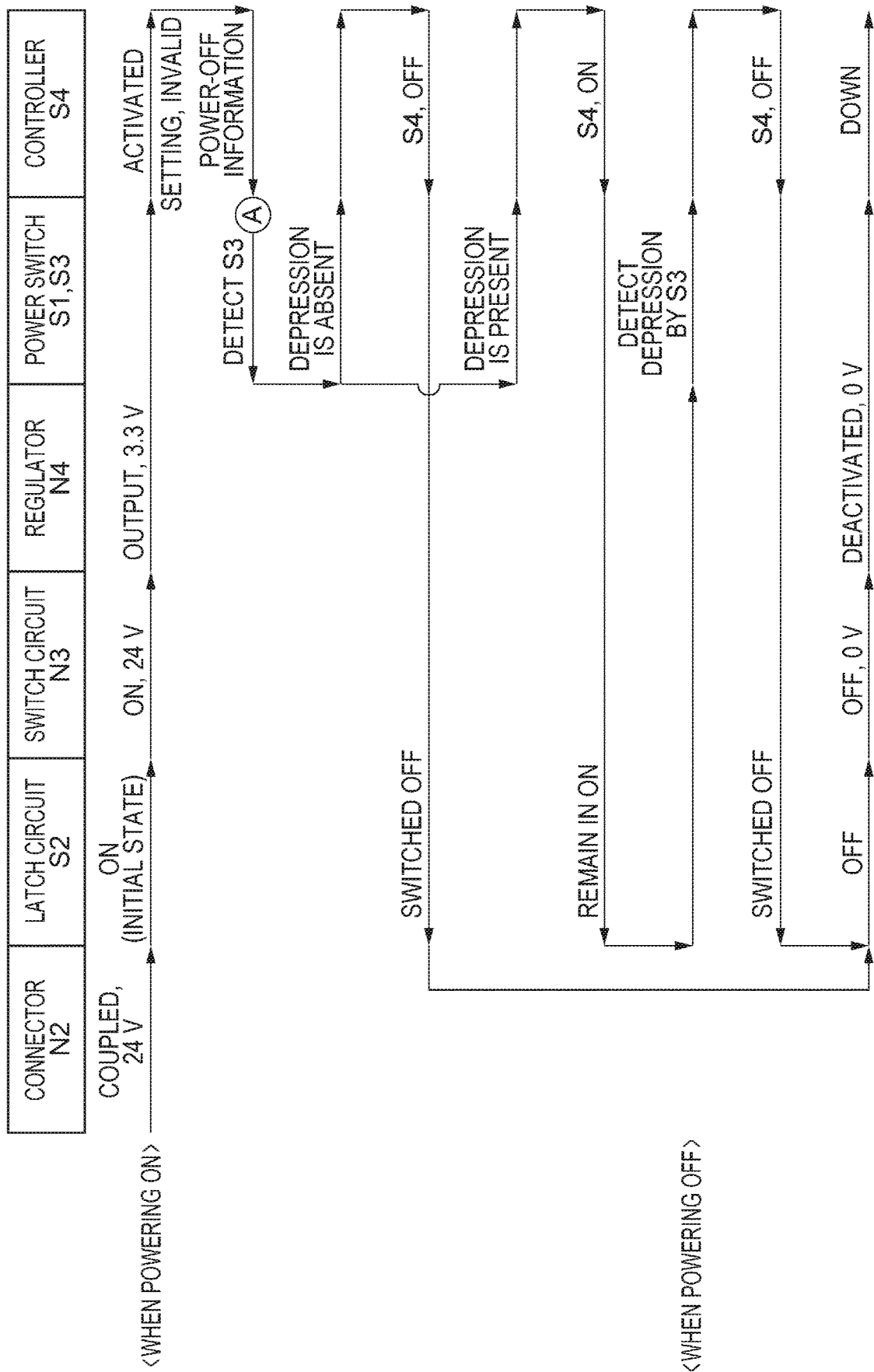
FIG. 3 is a state transition diagram when the setting information is invalid.

Next, with reference to FIG. 3, a description is given of a control method for powering on the printing apparatus 1 in the case where the setting stored in the storage 11 is invalid.

Assume that, after storage of the power-off information in the storage 11 based on depression of the power switch 12, the printing apparatus 1 was powered off and then switching off of the circuit breaker 3, removal of the AC adapter 4, and so on were performed by the staff member and that the supply of power to the printing apparatus 1 has thus been discontinued. Alternatively, as described below, assume that the storage 11 was in the so-called default settings, which is the settings at the time of factory shipment. Thereafter, assume that switching on of the circuit breaker 3, coupling of the AC adapter 4, and so on were performed by the staff member and that power has thus been supplied to the printing apparatus 1.

When power is supplied to the printing apparatus 1, 24 V is applied to the node N2 after the connector 17. At this point, 24 V is supplied from the connector 17 to the switch circuit 14 and the latch circuit 13.

Since, in the latch circuit 13, the initial state is the on-state, when supplied with 24 V, the latch circuit 13 is switched on and outputs the switch-on signal S2 to the switch circuit 14 to switch on the switch circuit 14. As a result, the switch circuit 14 outputs 24 V, 24 V is applied to the node N3, and 24 V is supplied to the regulator 15 and the actuator 16.

The regulator 15 supplied with 24 V outputs 3.3 V, and 3.3 V is applied to the node N4. As a result, 3.3 V is supplied to the controller 10 and the storage 11, enabling the CPU of the controller 10 to be activated.

The control method described so far is the same as the above-described method for controlling the printing apparatus 1 when powered on in the case where the setting stored in the storage 11 is valid.

The controller 10 reads out the setting stored in the storage 11. In this case, the setting is invalid. The controller 10 further reads out the power-off information stored in the storage 11. In the default settings of the storage 11, the setting is invalid and, in addition, the power-off information is stored.

The process after symbol A, which is a connector in FIG. 3, is referred to as a process A. The process A is used in the description given below with reference to FIG. 4.

Since the setting in the storage 11 is invalid and the power-off information is stored, the controller 10 performs detection of input of the signal S3 from the power switch 12. That is, the controller 10 performs detection of depression of the power switch 12. In contrast to the case where the setting is valid as described with reference to FIG. 2, the controller 10 does not ignore the signal S3 from the power switch 12. The time during which the controller 10 detects input of the signal S3 from the power switch 12 may be within a predetermined time.

When the controller 10 detects input of the signal S3 from the power switch 12, the controller 10 may determine that depression of the power switch 12 is present. In this case, for example, the signal S3 is a signal that has been changed from the switch-off signal to the switch-on signal.

When the controller 10 determines that depression of the power switch 12 is present, the controller 10 outputs the switch-on signal S4 to the latch circuit 13.

Since the latch circuit 13 has already been switched on, the latch circuit 13 remains in the on-state and the switch circuit 14 also remains in the on-state, and thus 24 V may continue to be supplied. As a result, the printing apparatus 1 is in a powered-on state.

In contrast, when the controller 10 does not detect input of the signal S3 from the power switch 12, the controller 10 may determine that depression of the power switch 12 is absent. In this case, for example, the signal S3 is kept as the switch-off signal and does not change.

When the controller 10 determines that depression of the power switch 12 is absent, the controller 10 outputs the switch-off signal S4 to the latch circuit 13 to switch off the latch circuit 13. The latch circuit 13 outputs the switch-off signal S2 to the switch circuit 14 to switch off the switch circuit 14.

The switch circuit 14 is switched off and the node N3 is at 0 V and thus the supply of 24 V to the regulator 15 is blocked, and therefore the regulator 15 is deactivated and the node N4 is at 0 V. The supply of 3.3 V to the controller 10 and the storage 11 is blocked, and thus the controller 10 and the storage 11 are down. As a result, the printing apparatus 1 is not in a powered-on state.

Subsequently, a description is given of a control method for powering off the printing apparatus 1 in the case where the setting stored in the storage 11 is invalid. In this case, the printing apparatus 1 is powered on by depression of the power switch 12.

Since the setting is invalid, the controller 10 performs detection of input of the signal S3 from the power switch 12. That is, the controller 10 performs detection of depression of the power switch 12. In contrast to the case where the setting is valid, the controller 10 does not ignore the signal S3 from the power switch 12. The controller 10 may detect input of the signal S3 from the power switch 12 at predetermined time intervals.

When the controller 10 detects input of the signal S3 from the power switch 12, the controller 10 may determine that depression of the power switch 12 is present. In this case, for example, the signal S3 is a signal that has been changed from the switch-off signal to the switch-on signal.

When the controller 10 determines that depression of the power switch 12 is present, the controller 10 stores the power-off information in the storage 11. The controller 10 outputs the switch-off signal S4 to the latch circuit 13 to switch off the latch circuit 13. The latch circuit 13 outputs the switch-off signal S2 to the switch circuit 14 to switch off the switch circuit 14.

The switch circuit 14 is switched off and the node N3 is at 0 V and thus the supply of 24 V to the regulator 15 is blocked, and therefore the regulator 15 is deactivated and the node N4 is at 0 V. The supply of 3.3 V to the controller 10 and the storage 11 is blocked, and thus the controller 10 and the storage 11 are down. As a result, the printing apparatus 1 is in a powered-off state.

As described above, in the case where the setting stored in the storage 11 is invalid and the power-off information is stored, the controller 10 may power on the printing apparatus 1 based on depression of the power switch 12. Furthermore, the controller 10 may also power off the printing apparatus 1 based on depression of the power switch 12.

Figure 4:
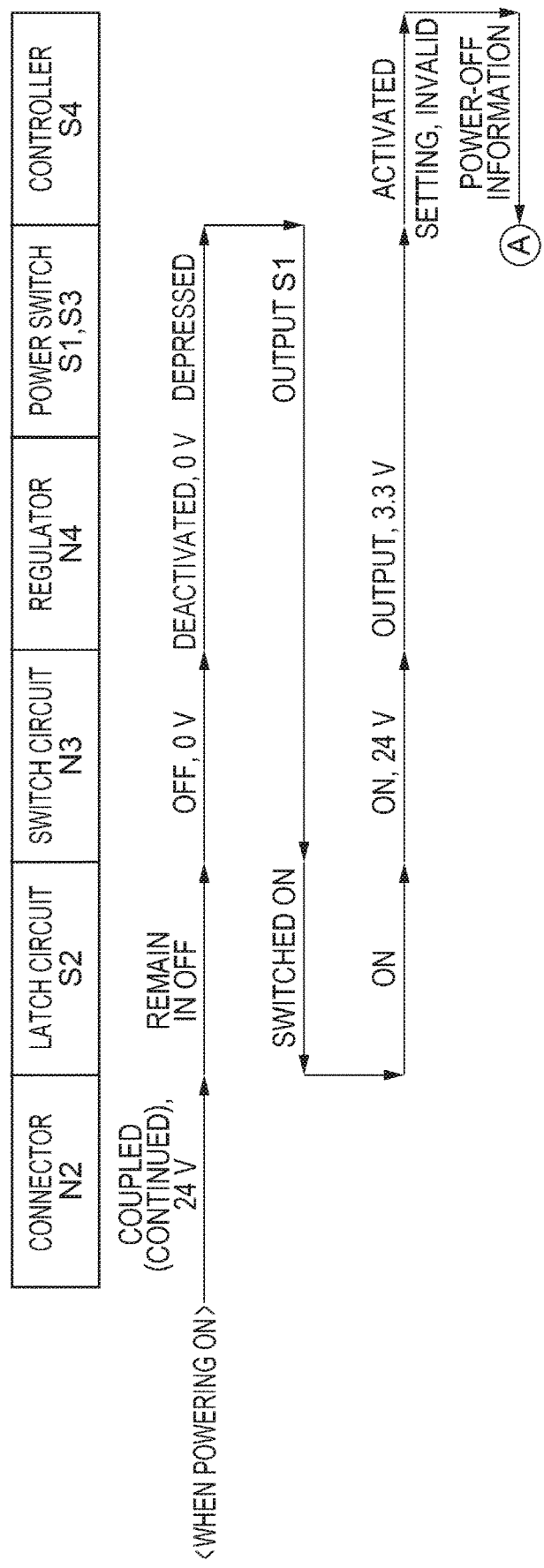
FIG. 4 is a state transition diagram when the setting information is invalid and after the power has been switched off by a power switch.

Next, with reference to FIG. 4, a description is given of a method for controlling the printing apparatus 1 when, in the case where the setting stored in the storage 11 is invalid, after the staff member has powered off the printing apparatus 1 by depressing the power switch 12, the staff member powers on the printing apparatus 1 again by depressing the power switch 12. Since the printing apparatus 1 has been powered off by depression of the power switch 12, the power-off information is stored in the storage 11.

Since the staff member has powered off the printing apparatus 1 by depressing the power switch 12, assume that the on-state of the circuit breaker 3, coupling of the AC adapter 4, and so on are continuing.

Therefore, 24 V is continuously applied to the node N2 after the connector 17. From the connector 17, 24 V is supplied to the switch circuit 14 and the latch circuit 13.

As in the case where the printing apparatus 1 is powered off by depression of the power switch 12, the latch circuit 13 remains in the off-state and continues outputting the switch-off signal S2 to the switch circuit 14, thus switching off the switch circuit 14.

The node N3 is at 0 V, and there is no supply of 24 V to the regulator 15 and therefore the regulator 15 is deactivated. Accordingly, the node N4 is also at 0 V and thus the controller 10 and the storage 11 are not supplied with 3.3 V. The controller 10 and the storage 11 are continuously down. The printing apparatus 1 continues in the powered-off state.

Under this condition, when the staff member depresses the power switch 12, the power switch 12 is switched to the on-state. The power switch 12 outputs the switch-on signal S1 as a trigger signal to the latch circuit 13.

As a result, the latch circuit 13 is switched on, enabling the switch circuit 14 to be switched on to apply 24V to the node N3. The regulator 15 and the actuator 16 are supplied with 24 V, and the regulator 15 outputs 3.3 V, which is applied to the node N4. The controller 10 and the storage 11 are supplied with 3.3 V, and thus the CPU of the controller 10 is activated.

The controller 10 reads out the setting stored in the storage 11. In this case, the setting is invalid. Furthermore, the controller 10 reads out the power-off information stored in the storage 11. The controller 10 reads out these items and subsequently executes the process A in FIG. 3. The process A is the same as described above with reference to FIG. 3 and therefore the description will not be repeated here.

As illustrated in FIG. 4, without depending on the controller 10, in other words, even when the controller 10 is in the down state, the latch circuit 13 may be switched on based on depression of the power switch 12. As a result, the switch circuit 14 is switched on and the regulator 15 outputs 3.3 V, thereby enabling the CPU of the controller 10 to be activated.

The signal S3 from the power switch 12 changes from the off-state to the on-state, together with the signal S1, based on depression of the power switch 12. The signal S3 from the power switch 12 may be configured to remain in the on-state until the controller 10 detects input of the signal S3.

After powering off the printing apparatus 1 by depressing the power switch 12, the staff member attempts to power on the printing apparatus 1 again by depressing the power switch 12. At this point, as described above, in the case where the setting stored in the storage 11 is invalid and the power-off information is stored, the controller 10 may power on the printing apparatus 1 based on depression of the power switch 12. In addition, the controller 10 may also power off the printing apparatus 1 based on depression of the power switch 12.

Figure 5:
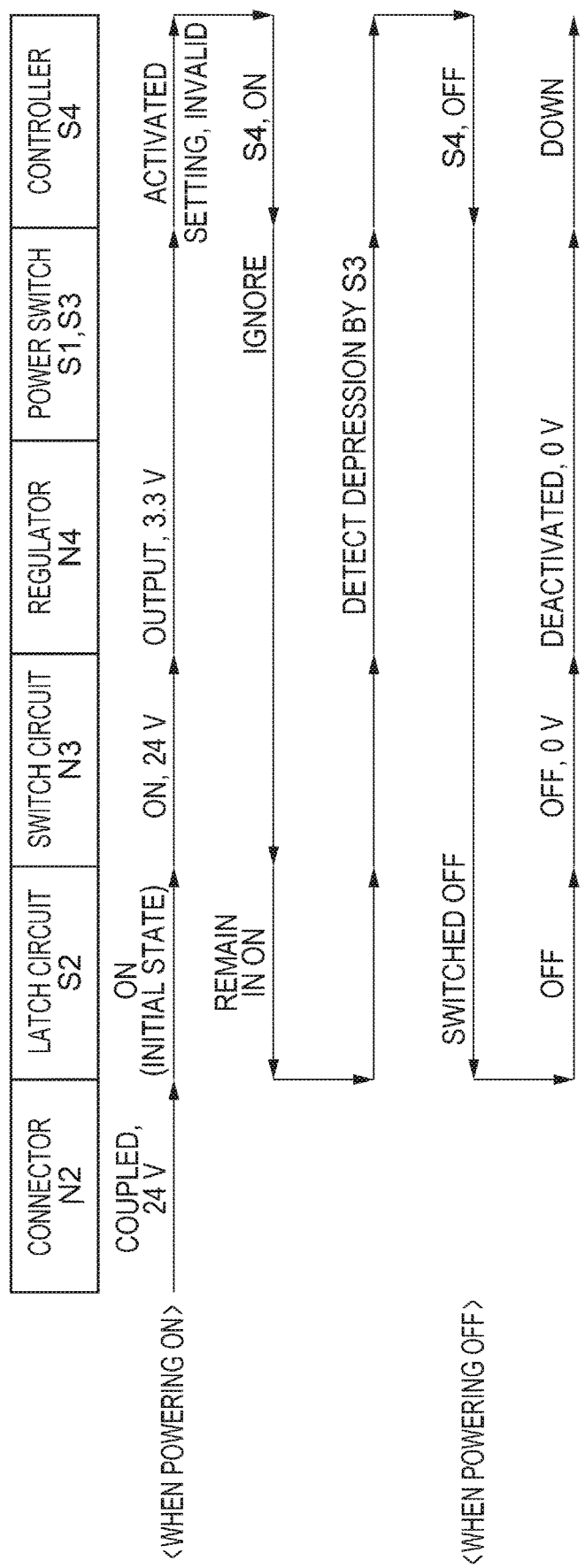
FIG. 5 is a state transition diagram when the setting information is invalid and after the power has been switched off without use of a power switch.

Next, with reference to FIG. 5, assume that, after powering on the printing apparatus 1 by depressing the power switch 12, the staff member performed switching off of the circuit breaker 3, removal of the AC adapter 4, and so on. A description is given of a method for controlling the printing apparatus 1 when, thereafter, the staff member powers on the printing apparatus 1 by performing switching on of the circuit breaker 3, coupling of the AC adapter 4, and so on. The setting stored in the storage 11 is invalid.

In this case, since switching off of the circuit breaker 3, removal of the AC adapter 4, and so on were performed by the staff member and the printing apparatus 1 was thus powered off, the power-off information is not stored in the storage 11.

When, after the latch circuit 13 has been maintained in the on-state and the printing apparatus 1 has thus been powered on by depression of the power switch 12, supply of 24 V to the connector 17 is blocked and, again, switching on of the circuit breaker 3, coupling of the AC adapter 4, and so on are performed by the staff member such that power is supplied to the printing apparatus 1, 24 V is applied to the node N2 after the connector 17. At this point, 24 V is supplied from the connector 17 to the switch circuit 14 and the latch circuit 13.

Since, in the latch circuit 13, the initial state is the on-state, when supplied with 24 V, the latch circuit 13 is switched on and outputs the switch-on signal S2 to the switch circuit 14 to switch on the switch circuit 14. As a result, the switch circuit 14 outputs 24 V, 24 V is applied to the node N3, and 24 V is supplied to the regulator 15 and the actuator 16.

The regulator 15 supplied with 24 V outputs 3.3 V, and 3.3 V is applied to the node N4. As a result, 3.3 V is supplied to the controller 10 and the storage 11, enabling the CPU of the controller 10 to be activated.

The controller 10 reads out the setting stored in the storage 11. In this case, the setting is invalid. As mentioned above, the power-off information is not stored in the storage 11.

Even though the setting in the storage 11 is invalid, since the power-off information is not stored, the controller 10 ignores the signal S3 from the power switch 12 and outputs the switch-on signal S4 to the latch circuit 13. That is, the controller 10 does not detect depression of the power switch 12.

Since the latch circuit 13 has already been switched on, the latch circuit 13 remains in the on-state and the switch circuit 14 also remains in the on-state, and thus 24 V may continue to be supplied. As a result, the printing apparatus 1 is in a powered-on state.

Subsequently, a description is given of a control method for powering off the printing apparatus 1. Since the setting is invalid, the controller 10 performs detection of input of the signal S3 from the power switch 12. That is, the controller 10 performs detection of depression of the power switch 12.

When the controller 10 detects input of the signal S3 from the power switch 12, the controller 10 may determine that depression of the power switch 12 is present. When the controller 10 determines that depression of the power switch 12 is present, the controller 10 stores the power-off information in the storage 11. Then, the controller 10 outputs the switch-off signal S4 to the latch circuit 13 to switch off the latch circuit 13.

Then, the latch circuit 13 outputs the switch-off signal S2 to the switch circuit 14 to switch off the switch circuit 14. The switch circuit 14 is switched off and the node N3 is at 0 V and thus the supply of 24 V to the regulator 15 is blocked, and therefore the regulator 15 is deactivated and the node N4 is at 0 V. The supply of 3.3 V to the controller 10 and the storage 11 is blocked, and thus the controller 10 and the storage 11 are down. As a result, the printing apparatus 1 is in a powered-off state.

After powering on the printing apparatus 1 by depressing the power switch 12, the staff member performs switching off of the circuit breaker 3, removal of the AC adapter 4, and so on and thereafter attempts to power on the printing apparatus 1 by performing switching on of the circuit breaker 3, coupling of the AC adapter 4, and so on.

Then, when switching on of the circuit breaker 3, coupling of the AC adapter 4, and so on are performed by the staff member and thus the supply of power to the printing apparatus 1 is performed, as described above, the controller 10 may power on the printing apparatus 1, regardless of depression of the power switch 12, in the case where the setting stored in the storage 11 is invalid and the power-off information is not stored. Furthermore, since the setting is invalid, the controller 10 may also power off the printing apparatus 1 upon detecting depression of the power switch 12.

According to the embodiments described above, with a simple configuration using the momentary power switch 12, the controller 10 may activate, that is, power on the printing apparatus 1 by determining whether the setting stored in the storage 11 is valid or invalid.

Although these embodiments have been described above in detail with reference to the drawings, specific configurations are not limited to the embodiments and changes, replacements, deletions, and so on may be made without departing from the scope of the disclosure.

As described above, the head of the printing apparatus 1 has been described using an example of a line thermal head; however, there are no restrictions on the method for heads. For example, the head may be an ink jet head.

The recording medium, which has been described using an example of thermal paper, may be plain paper when the head is an ink jet head.

As described above, in the case where the setting stored in the storage 11 is invalid, the controller 10 determines whether the power-off information is stored in the storage 11 and performs control. However, the controller 10 may not determine whether the power-off information is stored. In this case, the controller 10 may perform a process as described with reference to FIG. 3 and may perform control so as to detect depression of the power switch 12 when powering on the printing apparatus 1 as well as when powering off the printing apparatus 1.

Although, as described above, the logic voltage is 3.3 V, the logic voltage may be 5 V.

What is claimed is:

1. A printing apparatus comprising:
   a connector configured to receive supply of first power from outside;
   a switch circuit configured to supply the first power to a regulator;
   a latch circuit configured to control the switch circuit;
   a power switch configured to hold the latch circuit in a predetermined state;
   a controller configured to hold the latch circuit in the predetermined state and to detect an operation of the power switch; and
   a storage configured to store setting information, wherein
   in response to supply of the first power to the connector, the latch circuit is configured to, when supplied with the first power and when the predetermined state is a first state, switch on the switch circuit to supply the first power to the regulator,
   the regulator is configured to generate second power based on the supplied first power and to supply the second power to the controller and the storage, and
   the controller is configured to, when the setting information in the storage is valid, maintain the latch circuit in the first state without performing detection of the operation of the power switch.

2. The printing apparatus according to claim 1, wherein the controller is configured to:
   when the setting information in the storage is invalid, perform detection of the operation of the power switch,
   when the operation of the power switch is detected, maintain the latch circuit in the first state, and
   when the operation of the power switch is not detected, switch the latch circuit to a second state different from the first state and switch off the switch circuit to block supply of the first power to the regulator.

3. The printing apparatus according to claim 2, wherein the controller is further configured to:
   after maintaining the latch circuit in the first state, further perform detection of an operation of the power switch, and
   when the operation of the power switch is detected, switch the latch circuit from the first state to the second state and switch off the switch circuit to block supply of the first power to the regulator.

4. The printing apparatus according to claim 3, wherein the latch circuit is configured to, after switching off of the switch circuit based on the operation of the power switch, remain in the second state, and
   the power switch is configured to, when operated, switch the latch circuit from the second state to the first state and switch on the switch circuit to supply the first power to the regulator.

5. The printing apparatus according to claim 2, wherein
   when, after maintaining the latch circuit in the first state, supply of the first power to the connector is blocked and the first power is again supplied to the connector, the latch circuit is configured to enter the first state and to switch on the switch circuit to supply the first power to the regulator,
   the regulator is configured to generate the second power based on the supplied first power and to supply the second power to the controller and the storage, and
   the controller is configured to:
   even when the setting information in the storage is invalid, maintain the latch circuit in the first state without performing detection of an operation of the power switch, and
   when thereafter detection of an operation of the power switch is performed and an operation of the power switch is detected, switch the latch circuit from the first state to the second state and switch off the switch circuit to block supply of the first power to the regulator.

6. The printing apparatus according to claim 1, wherein the power switch is of a momentary type.

7. A method for controlling a printing apparatus, the printing apparatus including a connector configured to receive supply of first power from outside, a switch circuit configured to supply the first power to a regulator, a latch circuit configured to control the switch circuit, a power switch configured to hold the latch circuit in a predetermined state, and a storage configured to hold the latch circuit in the predetermined state and to store setting information, the method comprising:
   in response to supply of the first power to the connector, by the latch circuit, when the latch circuit is supplied with the first power and when the predetermined state is a first state, switching on the switch circuit to supply the first power to the regulator,
   generating, by the regulator, second power based on the supplied first power and supplying the second power to the storage; and
   when the setting information in the storage is valid, maintaining the latch circuit in the first state without performing detection of an operation of the power switch.

* * * * *